(12) United States Patent
Huang et al.

(10) Patent No.: US 10,607,856 B2
(45) Date of Patent: Mar. 31, 2020

(54) MANUFACTURING METHOD OF REDISTRIBUTION LAYER

(71) Applicant: Powertech Technology Inc., Hsinchu County (TW)

(72) Inventors: Kun-Yung Huang, Hsinchu County (TW); Chih-Fu Lung, Hsinchu County (TW); Shih-Chi Li, Hsinchu County (TW); Mei-Chen Lee, Hsinchu County (TW); Chung-Hao Tsai, Hsinchu County (TW); Chi-Liang Wang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 243 days.

(21) Appl. No.: 15/626,165

(22) Filed: Jun. 18, 2017

(65) Prior Publication Data
US 2018/0366344 A1  Dec. 20, 2018

(51) Int. Cl.
*H05K 3/02* (2006.01)
*H01L 21/48* (2006.01)
*H01L 21/683* (2006.01)

(52) U.S. Cl.
CPC ........ *H01L 21/4846* (2013.01); *H01L 21/481* (2013.01); *H01L 21/6835* (2013.01); *H01L 2221/68359* (2013.01); *Y10T 29/49156* (2015.01)

(58) Field of Classification Search
CPC . H01L 24/03; H01L 24/11; H01L 2224/0345; H01L 2224/0346; H01L 2224/0347; H01L 2224/024; H01L 2224/81005; H01L 2224/11; H01L 2224/1146; H01L 2224/1147; H05K 1/0298; Y10T 29/49156

USPC ........................... 29/847, 825, 829, 846, 849
See application file for complete search history.

(56) References Cited

U.S. PATENT DOCUMENTS

| 7,045,471 | B2 | 5/2006 | Kobayashi | |
| 8,698,323 | B2* | 4/2014 | Mohammed | ........ H01L 23/5389 |
| | | | | 257/692 |
| 2012/0293474 | A1* | 11/2012 | Sun | ........ G01J 1/0488 |
| | | | | 345/207 |

(Continued)

FOREIGN PATENT DOCUMENTS

| CN | 104238270 | 12/2014 |
| TW | I292853 | 1/2008 |
| TW | 201248686 | 12/2012 |

OTHER PUBLICATIONS

"Office Action of Taiwan Counterpart Application," dated Jan. 8, 2018, p. 1-p. 5, in which the listed reference was cited.

*Primary Examiner* — Thiem D Phan
(74) *Attorney, Agent, or Firm* — JCIPRNET

(57) ABSTRACT

A manufacturing method of a redistribution layer is provided. The method includes the following steps. A patterned sacrificial layer is formed on a carrier. An actuate angle is formed between a side wall of the patterned sacrificial layer and the carrier. A first conductive layer is formed. The first conductive layer includes a plurality of first portions formed on the carrier and a plurality of second portions formed on the patterned sacrificial layer. The patterned sacrificial layer and the second portions of the first conductive layer are removed from the carrier. Another manufacturing method of a redistribution layer is also provided.

9 Claims, 3 Drawing Sheets

(56) References Cited

U.S. PATENT DOCUMENTS

2014/0363915 A1\* 12/2014 Tsai ..................... G03F 7/0382
438/46

\* cited by examiner

MANUFACTURING METHOD OF REDISTRIBUTION LAYER

BACKGROUND OF THE INVENTION

Field of Invention

The present disclosure relates to a package structure manufacturing method, and more particularly, to a manufacturing method of redistribution layer.

Description of Related Art

As semiconductor dies become smaller, a finer pitch of electrical interconnection is required to connect to the semiconductor die. In a conventional method of forming redistribution layer (RDL) such as using a photolithography process and an etching process may lead to undercutting along with an undesirable curved metal profile (e.g. an undercut between a seed layer and a substrate). Moreover, the critical dimension of the pattern in a photoresist layer may be too small to etch or cause the incomplete etching away of the metal layer which may result in the problem of electrical leakage. In addition, since a small amount difference in the critical dimension of RDL will lead to dramatic changes in electrical performance of the device, it is important to control the uniformity of the critical dimension. Accordingly, an improved method of forming a redistribution layer has become a challenge to researchers in the field.

SUMMARY OF THE INVENTION

The disclosure provides a manufacturing method of a redistribution layer (RDL), which achieves the finer pitch RDL with improved uniformity of the critical dimension and avoids forming an undesirable undercut.

The disclosure provides a manufacturing method of a redistribution layer. The method includes the following steps. A patterned sacrificial layer is formed on a carrier. An actuate angle is formed between a side wall of the patterned sacrificial layer and the carrier. A first conductive layer is formed. The first conductive layer includes a plurality of first portions formed on the carrier and a plurality of second portions formed on the patterned sacrificial layer. The patterned sacrificial layer and the second portions of the first conductive layer are removed from the carrier.

The disclosure provides a manufacturing method of a redistribution layer. The method includes the following steps. A patterned sacrificial layer is formed on a carrier. A cross-sectional profile of the patterned sacrificial layer is inverted trapezoid. A first conductive layer is formed on the carrier and a top surface of the patterned sacrificial layer spaced apart from the carrier. The patterned sacrificial layer and a portion of the first conductive layer formed on the top surface of the patterned sacrificial layer are removed. A pitch of the first conductive layer left on the carrier is 4 µm to 10 µm.

Based on the above, since the actuate angle is formed between the side wall of the patterned sacrificial layer and the carrier which makes the first conductive layer difficult to be formed on the side wall of the patterned sacrificial layer, the forming process of RDL may be substantially complete after removing the patterned sacrificial layer without performing additional etching process. As such, an undesirable undercut profile of RDL resulting from the etching process can be avoided. In addition, the manufacturing method may allow for the formation of fine pitch RDL without limited by the lithography resolution. In addition, it may provide the improved uniformity of the critical dimension of RDL.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
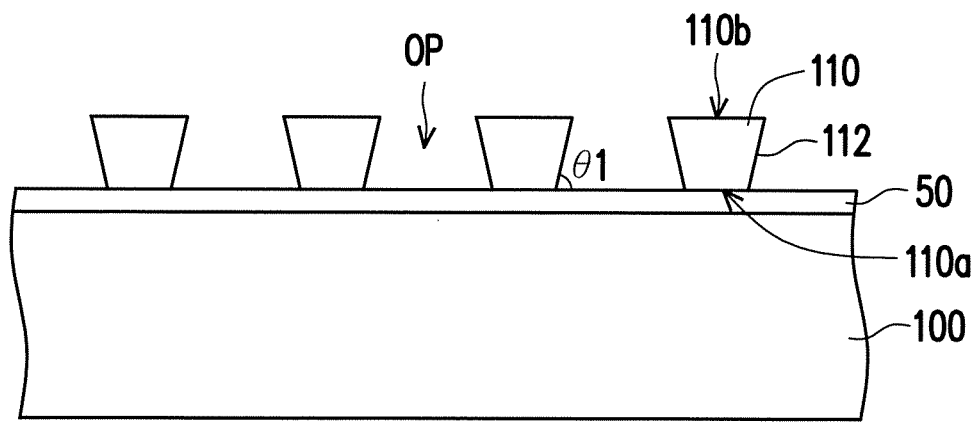
FIG. 1A to FIG. 1C are schematic cross-sectional views illustrating a manufacturing method of a RDL according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
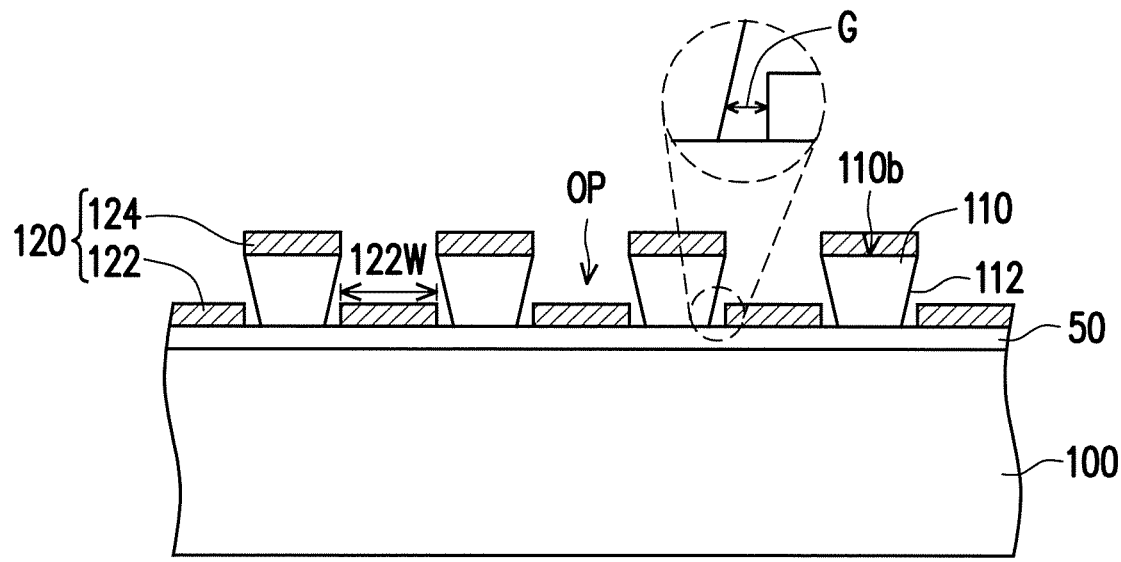
Figure 1C:
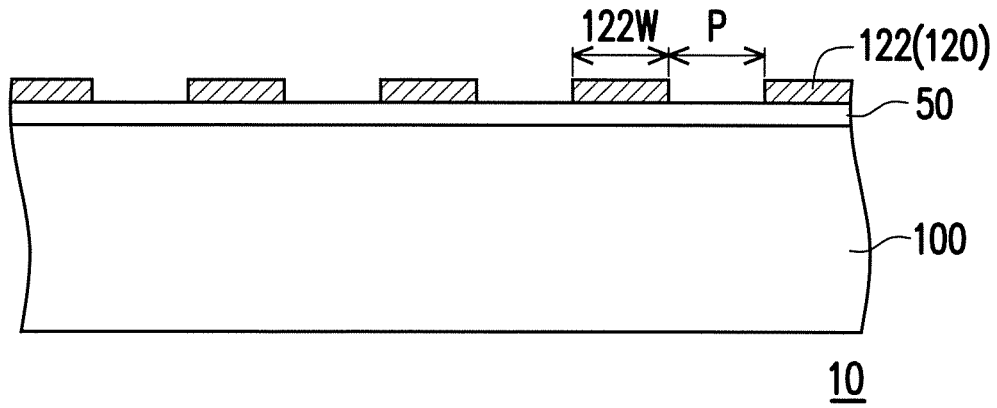

FIG. 1A to FIG. 1C are schematic cross-sectional views illustrating a manufacturing method of a RDL according to an embodiment of the disclosure. Referring to FIG. 1A, a patterned sacrificial layer 110 may be formed on a carrier 100. For example, the carrier 100 may be made of glass, plastic or other suitable materials as long the material is able to withstand the subsequent processes performed thereon. The patterned sacrificial layer 110 may include photoresist materials. In some embodiments, a resist layer may be formed on the carrier 100 by printing, spin coating, or other suitable techniques, and then patterned by exposure and development to form the patterned sacrificial layer 110. In other word, a plurality of openings OP of the patterned sacrificial layer 110 may be formed after patterning the resist layer.

For instance, the patterned sacrificial layer 110 may have a bottom surface 110a facing towards the carrier 100 and a top surface 110b opposite to the bottom surface 110a. In addition, the patterned sacrificial layer 110 may have a side wall 112 disposed between the top surface 110b and the bottom surface 110a after forming the openings OP. For example, a cross-sectional profile of the patterned sacrificial layer 110 may be inverted trapezoid. In other word, the area of the top surface 110b of the patterned sacrificial layer 110 is greater than the area of the bottom surface 110a of the patterned sacrificial layer 110. Moreover, an included angle between the side wall 112 of the patterned sacrificial layer 110 and the carrier 100 may be formed as an actuate angle θ1. In some embodiments, the actuate angle θ1 may range from 80 degrees to 88 degrees. In some other embodiments, the cross-sectional profile of the patterned sacrificial layer 110 may be inverted isosceles trapezoid.

In some embodiments, before forming the patterned sacrificial layer 110 on the carrier 100, an adhesive layer 50 may be formed on the carrier 100 in order to enhance the attachment between the carrier 100 and a conductive layer 120 formed in the subsequent process. For example, the adhesive layer 180 may include epoxy resin, inorganic materials (such as silicon oxide, metal oxide or the like), organic polymer materials (such as polyimide, butylcyclobutene or the like) or other suitable adhesive materials, which is not limited thereto.

Referring to FIG. 1B, a conductive layer 120 may be formed on the carrier 100 and the top surface 110b of the patterned sacrificial layer 110. The conductive layer 120 may include a plurality of first portions 122 and a plurality of second portions 124. For example, the first portions 122 may be formed in the openings OP of the patterned sacrificial layer 110 and on the carrier 100. In some embodiments, a line width 122w of each of the first portions 122 of the conductive layer 120 may be 2 μm to 5 μm. The second portions 124 may be formed on the top surface 110b of the patterned sacrificial layer 110. The conductive layer 120 may be formed by such as a physical vapor deposition (e.g. sputtering process, evaporation process, or the like) or other suitable process.

In some embodiments, after forming the conductive layer 120, a space is formed between each of the first portions 122 and each of the second portions 124. Since the cross-sectional profile of the patterned sacrificial layer 110 is an inverted trapezoid, a gap G may be formed between the first portions 122 of the conductive layer 120 and the side wall 112 of the patterned sacrificial layer 110 on the carrier 100. In some embodiments, the conductive layer 120 may not be formed in the gap G such that the first portions 122 and the second portions 124 of the conductive layer 120 may be spatially separated from each other. In other word, the profile of side wall 112 of the patterned sacrificial layer 110 may prevent the conductive layer 120 from being formed in the gap G.

Referring to FIG. 1C, the patterned sacrificial layer 110 and the second portions 124 of the conductive layer 120 may be removed from the carrier 100 using an appropriate stripping process such that the first portions 122 of the conductive layer 120 left on the carrier 100 is referred as a redistribution layer (RDL) 10. For example, in some embodiments, the RDL 10 may redistribute the conductive trace for signal transmission of the chip package. In some other embodiments, after removing the patterned sacrificial layer 110, a pitch P between the adjacent first portions 122 of the conductive layer 120 may be 4 μm to 10 μm. As such, the manufacturing method described above may enable low cost fabrication of very fine pitch RDL at pitches below 10 μm lines/space (L/S). In addition, since the gap G may provide a well-defined break between the first portions 122 of the conductive layer 120 and the patterned sacrificial layer 110, the patterned sacrificial layer 110 may be easily removed from the carrier 100 without distorting the edges of the first portions 122 of the conductive layer 120. Therefore, the manufacturing method described above may avoid forming an undesirable undercut on the conductive layer 120 during an etching process. In addition, the aforementioned method may provide advantages over damascene-type process, which may be considerably more expensive compared to the processes described herein.

After removing the patterned sacrificial layer 110, a dielectric layer (not illustrated) may be formed on the carrier 100 as part of the RDL. Taking the present embodiment for example, after removing the patterned sacrificial layer 110, the dielectric layer may be formed on the carrier 100 to cover the first portions 122 of the conductive layer 120, while at least a portion of the top surface of the first portions 122 may be exposed by the dielectric layer for further electrical connection. In some embodiments, the aforementioned steps may be performed multiple times to obtain a multi-layered RDL as required by the circuit design. The topmost dielectric layer may then have openings exposing at least the portion of the topmost conductive layer for further electrical connection. In some embodiments, the RDL 10 may be formed before disposing a chip in a back-end manufacturing process of the package structure. In some other embodiments, the RDL 10 may be formed after encapsulating a chip by an encapsulant in a back-end manufacturing process of package structure. In such case, the RDL 10 may be formed on the encapsulant used as the carrier depending on the process requirement.

Figure 2A:
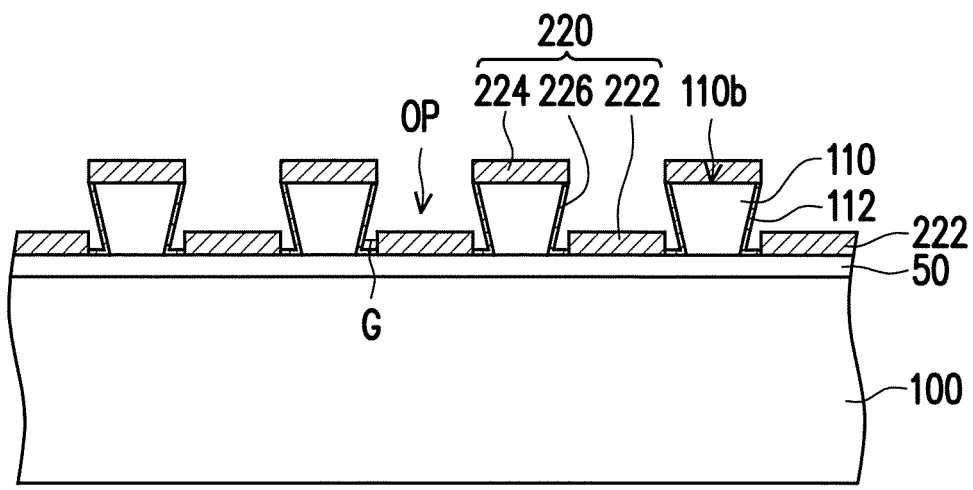
FIG. 2A to FIG. 2C are schematic cross-sectional views illustrating a manufacturing method of a RDL according to an embodiment of the disclosure.
Figure 2B:
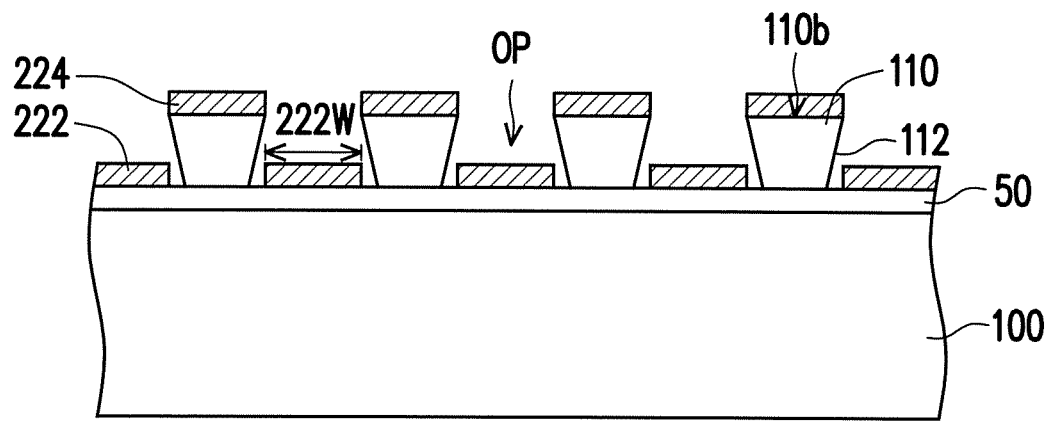
Figure 2C:
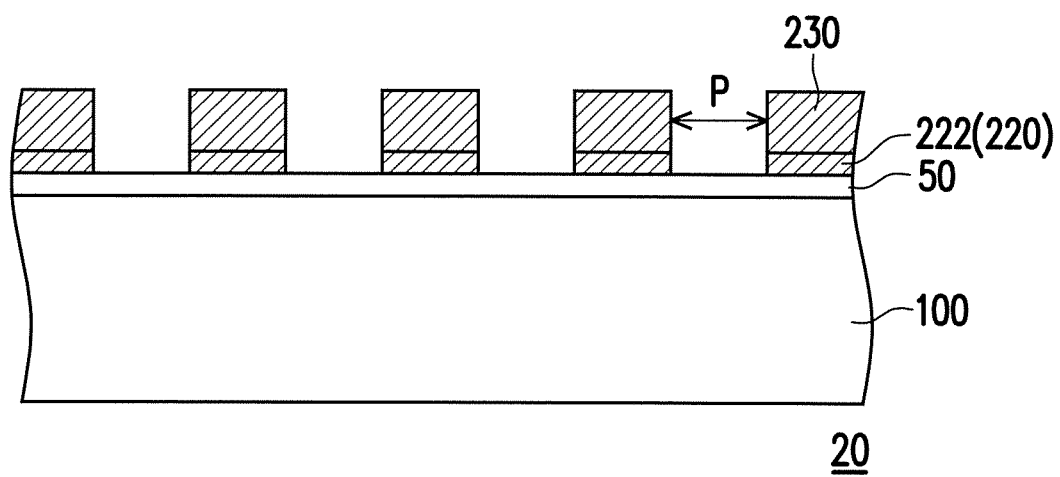

FIG. 2A to FIG. 2C are schematic cross-sectional views illustrating a manufacturing method of a RDL according to an embodiment of the disclosure. The manufacturing method of the present embodiment is similar to the embodiment illustrated in FIG. 1A to FIG. 1I. The difference lies in that, unlike the conductive layer 120 of FIG. 1, a first conductive layer 220 of FIG. 2A may include first portions 222, second portions 224 and third portions 226 when forming a first conductive layer 220 on the carrier 100 and on the patterned sacrificial layer 110. For example, when the first conductive layer 220 is formed, a thinner layer of the conductive material may be sputtered on the side wall 112 of the patterned sacrificial layer 110 due to the applied forming techniques (e.g. sputtering process, evaporation process, or the like). Referring to FIG. 2A, the third portions 226 formed on the side wall 112 of the patterned sacrificial layer 110 may be disposed between and coupled to the first portions 222 formed on the carrier 100 and the second portions 224 formed on the top surface 110b of the patterned sacrificial layer 110. In some embodiments, each of the first portions 222 may be respectively coupled to one of the second portions 224 through the third portions 226. In other word, the third portions 226 of the first conductive layer 220 may be formed in the gap G. In some other embodiments, at least a portion of the third portions 226 of the first conductive layer 220 may cover the side wall 112 of the patterned sacrificial layer 110 and/or the carrier 100.

In some embodiments, the thickness of each of the third portions 226 of the first conductive layer 229 may be less than the thickness of each of the first portions 222 or the thickness of each of the second portions 224 of the first conductive layer 220 depending on the forming techniques of the first conductive layer 220. However, the third portions 226 of the first conductive layer 220 may make the patterned sacrificial layer 110 removal difficult. As such, in some other embodiments, the third portions 226 of the first conductive layer 220 may be removed before removing the patterned sacrificial layer 110. For example, an isotropic etching process or other suitable removing process may be utilized to remove the third portions 226 of the first conductive layer 220. Referring to FIG. 2B, similar as shown in FIG. 1B, after removing the third portions 226 of the first conductive layer 220, the second portions 224 may be remained on the patterned sacrificial layer 110 and the first portions 222 may be remained in the openings OP of the patterned sacrificial layer 110 and on the carrier 100. In some embodiments, a line width 222w of each of the first portions 222 of the first conductive layer 220 may be similar with the line width 122w ranging from 2 μm to 5 μm.

Referring to FIG. 2C, the patterned sacrificial layer 110 and the second portions 224 of the first conductive layer 220 may be removed from the carrier 100 such that the first portions 222 of the first conductive layer 220 left on the carrier 100. The removing process of the patterned sacrificial layer 110 may be similar as shown in FIG. 1C, and the detailed descriptions are omitted herein. In some embodiments, after removing the patterned sacrificial layer 110, a second conductive layer 230 may be formed on the first conductive layer 220 corresponding to the first portions 222 of the first conductive layer 220 to form a thicker RDL 20. For example, the second conductive layer 230 may be formed by such as electroless-plating, chemical plating or other suitable process, which is not limited thereto. Since the line width 222w may be effectively controlled by the openings OP of the patterned sacrificial layer 110, the RDL 20 may obtain the better uniformity of the critical dimension compared to the conventional manufacturing method. As such, the RDL 20 in accordance with embodiments may allow for narrower line spacing width (fine pitch) and thinner lines. For example, the RDL 20 with pitches below 10 µm lines/space (L/S) may be provided. It is worthy to note that the dielectric layer may be formed thereafter to form the RDL. The forming process of the dielectric layer as mentioned above and the detailed descriptions are omitted herein.

Based on the foregoing, since the actuate angle is form between the side wall of the patterned sacrificial layer and the carrier, when forming the first conductive layer on the carrier, a gap is formed between the side wall of the patterned sacrificial layer and the first conductive layer. As such, the patterned sacrificial layer may be easily removed from the carrier without distorting the edges of the first conductive layer formed on the carrier. In addition, the manufacturing method described above enables low cost fabrication of very fine pitch RDL at pitches below 10 µm lines/space (L/S). Moreover, the aforementioned manufacturing method may avoid the problem resulting from the conventional method such as forming an undesirable undercut on the first conductive layer, causing the electrical leakage or the difficulty of controlling the uniformity of the critical dimension of RDL. In addition, the aforementioned manufacturing method may provide advantages over damascene-type process, which may be considerably more expensive compared to the processes described herein. Furthermore, it may depend on the design requirement to easily thicken the RDL by forming the second conductive layer on the first portions of the first conductive layer.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of a redistribution layer (RDL), comprising:
    forming a patterned sacrificial layer on a carrier, wherein an actuate angle is formed between a side wall of the patterned sacrificial layer and the carrier;
    forming a first conductive layer, wherein the first conductive layer comprises a plurality of first portions formed on the carrier, a plurality of second portions formed on the patterned sacrificial layer, and a plurality of third portions connected between the first portions and the second portions, wherein at least a portion of the third portions of the first conductive layer covers the side wall of the patterned sacrificial layer and extends from a bottom of the side wall of the patterned sacrificial layer to the first portions, wherein a step is between each of the third portions and each of the first portions; and
    removing the patterned sacrificial layer and the second portions of the first conductive layer from the carrier.

2. The manufacturing method according to claim 1, wherein the thickness of each of the third portions of the first conductive layer is less than the thickness of each of the first portions or the thickness of each of the second portions.

3. The manufacturing method according to claim 1, wherein the third portions of the first conductive layer are removed before removing the patterned sacrificial layer and the second portions of the first conductive layers from the carrier.

4. The manufacturing method according to claim 1, wherein after removing the patterned sacrificial layer and the second portions of the first conductive layers from the carrier, a pitch between the adjacent first portions of the first conductive layer is 4 µm to 10 µm.

5. The manufacturing method according to claim 1, wherein a line width of each of the first portions of the first conductive layer is 2 µm to 5 µm.

6. The manufacturing method according to claim 1, wherein the actuate angle formed between the side wall of the patterned sacrificial layer and the carrier is 80 degrees to 88 degrees.

7. The manufacturing method according to claim 1, the patterned sacrificial layer comprises a bottom surface facing towards the carrier and a top surface opposite to the bottom surface, the area of the top surface is greater than the area of the bottom surface.

8. The manufacturing method according to claim 1 further comprising forming a second conductive layer on the first conductive layer corresponding to the first portions of the first conductive layer after removing the patterned sacrificial layer and the second portions of the first conductive layer from the carrier.

9. The manufacturing method according to claim 8, wherein the first conductive layer is formed by physical vapor deposition and the second conductive layer is formed by an electroless-plating process or a chemical plating process.

* * * * *